United States Patent
Hummel (10) Patent No.: US 7,596,742 B1
(45) Date of Patent: Sep. 29, 2009

(54) ERROR DETECTION IN A COMMUNICATION LINK

(75) Inventor: Mark Hummel, Franklin, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 634 days.

(21) Appl. No.: 11/379,864

(22) Filed: Apr. 24, 2006

Related U.S. Application Data (60) Provisional application No. 60/786,546, filed on Mar. 28, 2006.

(51) Int. Cl.
*H03M 13/00* (2006.01)
(52) U.S. Cl. .................................... 714/776
(58) Field of Classification Search ............. 714/746, 714/751, 755, 758, 776; 709/232, 236
See application file for complete search history.

(56) References Cited

U.S. PATENT DOCUMENTS 5,185,862 A * 2/1993 Casper et al. ............... 709/236
6,748,442 B1 * 6/2004 Keller ......................... 709/232
7,120,845 B2 * 10/2006 Kwon et al. ................ 714/746

OTHER PUBLICATIONS

"HyperTransport(TM) I/O Link Specification, Revision 2.00b," Document #HTC20031217-0036-0009, HyperTransport Technology Consortium, Apr. 27, 2005, 325 pages.

* cited by examiner

*Primary Examiner*—Shelly A Chase
(74) *Attorney, Agent, or Firm*—Zagorin O'Brien Graham LLP (57) ABSTRACT

A communication protocol that allows an inserted control packet to immediately follow another control packet can be more robust to single bit errors when the two types of control packets can be distinguished using transmitted control signals to perform packet framing without having to examine the contents of the control packet.

15 Claims, 4 Drawing Sheets

FIG. 1

| BIT TIME | 7 | 6 | 5 | 4 | 3 | 2 | 1 | 0 |
|---|---|---|---|---|---|---|---|---|
| 0 | SeqId[3:2] | | Cmd[5:0] | | | | | |
| 1 | PassPW | SeqId[1:0] | | UnitID[4:0] | | | | |
| 2 | Command-Specific | | | | | | | |
| 3 | Command-Specific | | | | | | | |
| 4 | Addr[15:8] | | | | | | | |
| 5 | Addr[23:16] | | | | | | | |
| 6 | Addr[31:24] | | | | | | | |
| 7 | Addr[39:32] | | | | | | | |

FIG. 2A

| BIT TIME | 7 | 6 | 5 | 4 | 3 | 2 | 1 | 0 |
|---|---|---|---|---|---|---|---|---|
| 0 | Cmd Specific | | Cmd[5:0] | | | | | |
| 1 | | | | | | | | |
| 2 | Command-Specific | | | | | | | |
| 3 | Command-Specific | | | | | | | |

FIG. 2B

| BIT TIME | 7 | 6 | 5 | 4 | 3 | 2 | 1 | 0 |
|---|---|---|---|---|---|---|---|---|
| 0 | Data [7:0] | | | | | | | |
| 1 | Data [15:8] | | | | | | | |
| 2 | Data [23:16] | | | | | | | |
| 3 | Data [31:24] | | | | | | | |
| 4 | Data [39:32] | | | | | | | |
| 5 | Data [47:40] | | | | | | | |
| 6 | Data [55:48] | | | | | | | |
| 7 | Data [63:56] | | | | | | | |

ERROR DETECTION IN A COMMUNICATION LINK

CROSS-REFERENCE TO RELATED APPLICATION(S)

This application claims benefit under 35 U.S.C. § 119 of provisional application No. 60/786,546, filed Mar. 28, 2006, entitled "Method and Apparatus for Link Operations," naming Gerry R. Talbot, Paul Miranda, Mark D. Hummel, William A. Hughes, and Larry D. Hewitt as inventors, which application is incorporated by reference herein.

BACKGROUND

1. Field of the Invention

This invention relates to communications in computer systems and reduction of errors therein.

2. Description of the Related Art

In prior art computer systems, such as those incorporating a communication link operating in accordance with the HyperTransport™ I/O Link Specification, the protocol allows control packets to be inserted into a data packet or immediately after another control packet and before the data associated with that control packet is transferred. In the HyperTransport link protocol a control line is associated with each 16 bits of data. The control line identifies whether the packet on the link is a control packet or a data packet. However, when a control packet is followed immediately by another control packet, because control packets may be of different lengths, there is no way to distinguish between the first control packet and the second control packet without examining the contents of the first control packet to determine its length.

SUMMARY

It has been discovered that a communication protocol that allows an inserted control packet to immediately follow another control packet, where CRC packets are variably located in the transmissions, is more robust to single bit errors when the two control packets can be distinguished using the control bits and without having to examine the contents of the control packet.

Accordingly, in one embodiment a method is provided for a communication link having one or more groups of data lines for transmitting command information in control packets and data information in data packets and a separate control line associated with each group of data lines. The method includes identifying a first control packet being transmitted on the one or more groups of data lines according to a first encoding of the control bits supplied on the one or more control lines associated with the one or more group of data lines; and identifying a second control packet being transmitted on the one or more groups of data lines according to a second encoding of the control bits, the second control packet being transmitted immediately after transmission of the first control packet.

In another embodiment a method is provided for associating a control line with each byte of transferred information on a communication link; and distinguishing between a first control packet and a second control packet immediately following the first control packet according to respective values of the control line associated with each byte of transferred information.

In another embodiment an integrated circuit is provided that includes a plurality of first input terminals for receiving data signals; one or more control input terminals associated with the data signals; and a state machine responsive to frame a first and second control packet received consecutively on the first input terminals based solely on the control bits received on the one or more control input terminals.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
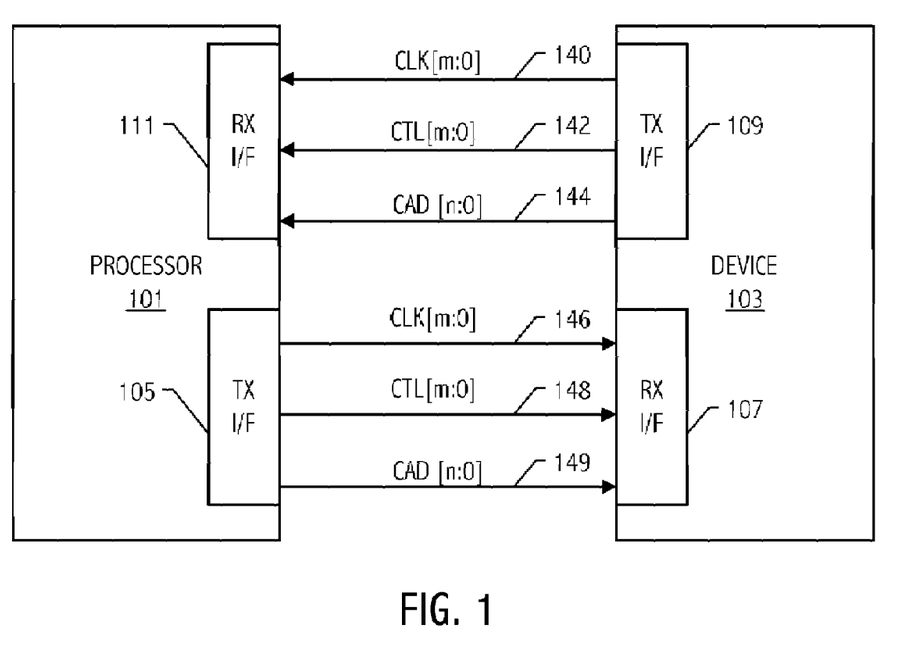
FIG. 1 illustrates an exemplary communication link that can utilize one or more embodiments of the invention described herein.

Referring to FIG. 1, illustrated is an exemplary communication link that can utilize one or more embodiments of the invention described herein. Typical implementations of the communication link include at least 8 signal lines carrying control, address, and data (CAD) information. Each 8 bits of CAD lines have an associated clock line and a control line. The control line indicates the type of information being carried on the CAD lines. In implementations with 16 bits of CAD lines (CAD[15:8]) and CAD[7:0]), two control lines are utilized. In other embodiments, fewer than 8 CAD lines are provided. As shown in FIG. 1, the signal lines are unidirectional in that they transmit information in only one direction. Thus, separate CAD lines 149, CTL lines 148 and CLK lines 146 are supplied by the transmit interface 105 on processor 101 and to the receiver interface 107 on the device 103. The device 103 may be another processor or may be any other kind of device in communication with the processor 101. In addition, while device 101 is shown as a processor, the communication link may be used to connect any two devices in a computer system. The device 103 includes a transmit interface 109 which supplies CAD lines 144, CTL lines 142, and CLK lines 140 to the receive interface 111. In FIG. 1, the number of control lines is indicated as n/8. That is true when the number of CAD lines in one direction is 8 or 16. When the number is fewer than 8, a single control line is provided. In one embodiment, the CAD lines may comprise different width of e.g., 2, 4, 8, 16, or 32 lines. With reference to FIG. 1, when n=1, 3, or 7, (CAD[1:0], CAD[3:0], or CAD[7:0]), m=0 for CLK[m:0] and CTL[m:0]. For 8, 16, and 32 CAD lines, there is a clock and control line for each byte, i.e., m=1 for 16 CAD lines and m=3 for 32 CAD lines. Each link may employ any one of the supported numbers of lines according to design choice. In addition, the link may provide a different number of CAD lines in each direction. Other embodiments may support other sizes of CAD lines as desired.

The clock line of the link may be utilized to derive a sample point for the control line and the CAD bus. In one particular embodiment, data/control bits may be transmitted on each edge (i.e. rising edge and falling edge) of the clock signal. Accordingly, two data bits per line may be transmitted per clock cycle. The amount of time employed to transmit one bit per line is referred to herein as a "bit time". The above-mentioned embodiment includes two bit times per clock cycle. A packet may be transmitted across one or more bit times depending upon the width of the CAD lines and the size of the packet. Multiple clock lines may be used depending upon the width of the control/address/data bus. For example, four clock lines may be used for a 32 bit control/address/data bus, one for each eight bit portion.

According to one embodiment, the CAD lines carry inverted data (i.e. a logical one is represented as a low voltage on the line, and a logical zero is represented as a high voltage). Alternatively, lines may carry non-inverted data (in which a logical one is represented as a high voltage on the line, and logical zero is represented as a low voltage). Note the lines may also be implemented as differential rather than single ended signals.

Figure 2A:
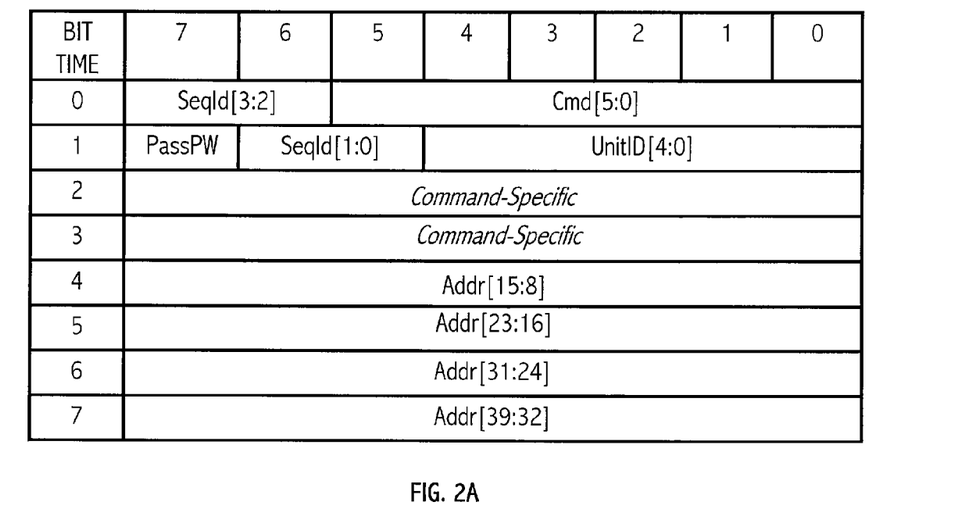
FIG. 2A illustrates an 8 byte control packet transferred on the communication links described herein.
Figure 2B:
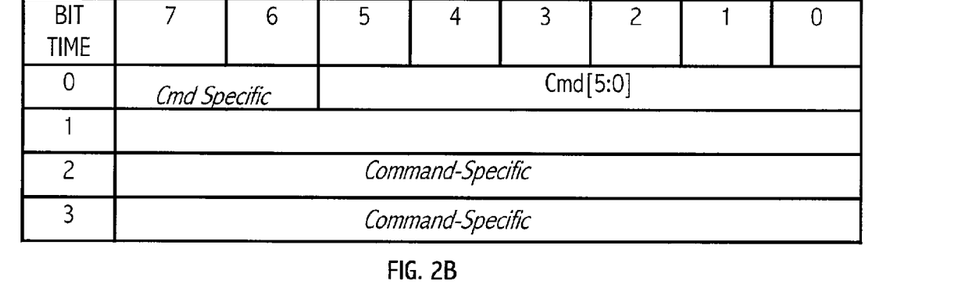
FIG. 2B illustrates a 4 byte control packet transferred on the communication links described herein.
Figure 2C:
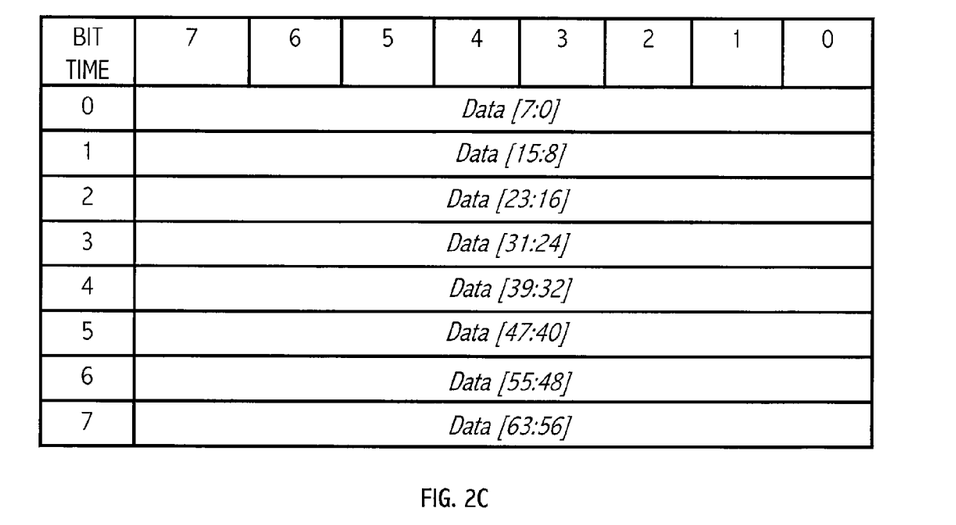
FIG. 2C illustrates an exemplary 8 byte data packet transferred on the communication links described herein.

FIGS. 2A-2C illustrate examples of the types of packets that are supplied over the communication link illustrated in FIG. 2. FIGS. 2A and 2B illustrate different types of control packets, having 8 bytes and 4 bytes, respectively. The control packets typically have a command field. The exemplary data packet in FIG. 2C is 8 bytes.

The overall reliability of a communication link, such as the one illustrated in FIG. 1, is highly dependent upon the link protocol's ability to detect single bit errors. Many communications links use cyclic redundancy checks (CRC) to provide for error detection. Typically, a number of CRC bytes are transferred after a particular number of data bytes. CRC uses a code that provides a unique number that is determined by the value of the information that is sent over the communication link. The transmit interface will generate the CRC. On receipt of information, the receive interface will use the same polynomial to generate the CRC. If the CRC that is sent by the transmit interface matches the CRC generated by the receive interface, the transfer is assumed to be correct. Note that in particular protocols the CRC may also include the value of all the control line(s). In one embodiment, CRC is separately provided for each 8 bits.

The protection provided by standard CRC algorithms (e.g., CRC-32) is significantly weakened when single bit errors can cause a mis-framing of a packet leading to an extended or shortened packet, in which case the incorrect beat of data will be used as the CRC result. A beat is defined herein as 32 bits of data. When the incorrect data is used as the CRC, the CRC-32 coverage is reduced to approximately 2-32 since the CRC beat is effectively a random value.

The difference between full single bit error detection and the above coverage scenario is significant for modern high-speed links. The follow calculations quantify the difference for links with a lane bit error rate (BERR) of $10^{-9}$ and $10^{-12}$ configured as 16 bidirectional lanes of 5 Gbit/lane/sec traffic.

An exemplary failure in time (FIT) rate (failures in billion hours) calculation for full single bit detection (640 bit packet) gives an idea of the difference in error detection capability. If you assume perfect single bit detection, two bits need to fail. Thus, for a BERR=$10^{-9}$:

$P\text{fail}\sim=P\text{fail(due to 2 bit error)}$ $=2^{-32}\times(2 \text{ of } 640)\times\text{BERR}^2\times(1-\text{BERR})^{638}=4.76\times10^{-23}$ $\text{BERR(effective)}=P\text{fail}/640=7.44^{-26}$ Fit rate=BERR(effective)$\times5\times10^9\times18\times2\times3600\times10^9$ $=4.82\times10^{-2}$ failures per billion hours In contrast, a FIT rate calculation for 1 in $2^{32}$ detection (640 bit packet) shows a much higher failure rate. For BERR=$10^{-9}$:

$P\text{fail}\sim=2^{-32}\times(1 \text{ of } 640)\times\text{BERR}\times(1-\text{BERR})^{639}=1.49\times10^{-6}$ $\text{BERR(effective)}=P\text{fail}/640=2.33\times10^{-19}$ Fit rate=BERR(effective)$\times5\times10^9\times16\times2\times3600\times10^9$ $=151000$ failures per billion hours An appropriate goal for link reliability should be on the order of a magnitude better than the FIT rate targets for processors (typically less than 100 FIT). Obviously, reliability goals are dependent upon the requirements of any particular system. Given that processors may have multiple links, e.g., some processors can have up to 4 16-bit links or more, that would place the per link failure target on the order of 1 failure per billion hours. The above numbers demonstrate that in order to achieve such a target, full single bit detection is required.

Note that certain AC coupled links (in which each side of the link has a separate ground plane) utilize additional coding to assure appropriate DC balance. The use of additional coding such as 8b10b can spread single bit errors. A single bit link error in the 8b10b domain can spread to 4 bits in a 5 bit pattern. Thus, such patterns should be fully detectable as well.

Figure 3:
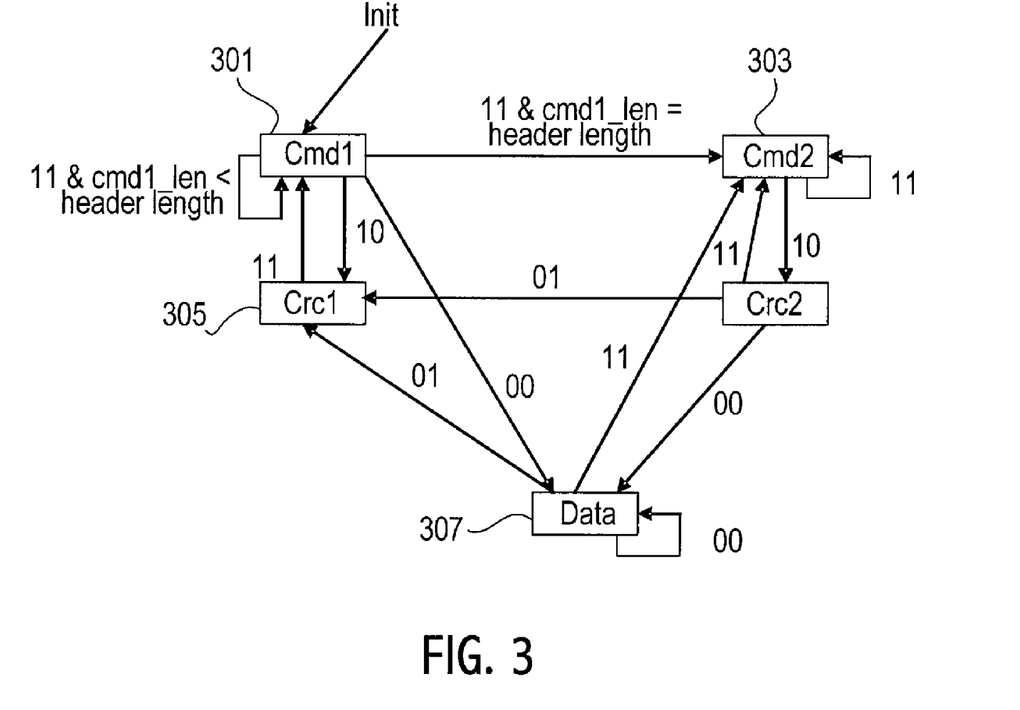
FIG. 3 illustrates a packet framing state machine whose operation can result in a higher rate of undetected single bit errors.

The mechanism in which framing errors can occur can be understood with relation to FIG. 3, which illustrates a framing protocol susceptible to single bit errors. Note that in the illustrated protocol in FIG. 3, control packets can be inserted into the middle of data packets or immediately after a first control packet and before data associated with the first control packet is transferred. The framing protocol illustrated in FIG. 3 assumes that one control line is provided for each 16 bits of CAD lines. The state machine in FIG. 3 assumes 32 CAD bits. For a 16 bit implementation, the value of the control bits is supplied during two bit times. Note that the state machine is simplified in that no error conditions are illustrated.

Thus, referring to FIG. 3, assume that after an initial condition (Init) a Cmd1 state 301 is entered. The command state has a variable length (header length) that can be determined by examining the contents of the control packet. That is, the number of bytes in the control packet can vary. As long as the control lines are equal to 11 and the packet length is less than the determined length, the state machine stays in the Cmd1 state 301. Assuming no errors, when the counter in the receive interface detects the length of Cmd1 has been reached, the state machine transitions to the Cmd2 state 303. Assume the scheme for encoding the CTL lines is as shown in the following table, where CTL-L is the control low for CAD[15:0] and CTL-H is the control line for CAD[31:16].

| CTL-L | CTL-H | |
|---|---|---|
| 1 | 1 | CTL BEAT |
| 0 | 0 | DATA BEAT |
| 1 | 0 | CRC (FOR DATA-LESS PACKET) |
| 0 | 1 | CRC (FOR PACKET WITH DATA) |

In the framing state machine illustrated in FIG. 3, on an 8 bit link every 32 bit beat transmits the following pattern on a CTL column: {CTL-L,CTL-L,CTL-H,CTL-H}. That is, on an eight bit link with a single control line, the single control line reflects the control lines that would be associated with a single contemporaneous 32 bit transfer. On a 16 bit link every 32 bit beat transmits the following pattern on a CTL column: {CTL-L,CTL-H}. Remember, in the system associated with the state diagram of FIG. 3, there is only one control line for every 16 CAD lines. Note that framing cannot be done based upon the values of CTL alone. The framer must examine the control packet to deduce header (i.e., the control packet) length.

With reference to FIG. 3, there are 3 failure cases that can adversely affect framing: The first error scenario is when the error is in a data lane and it corrupts the command field indicating an erroneous header length and/or data length. This scenario is analyzed additionally below. A second error scenario is when the error is in a data lane and it corrupts the data length field indicating an erroneous data length. In this case the data length can be determined directly from the framing state machine. This will cause a mismatch in the framed data length and the length field. As long as this case causes a retry, the link is resilient to single bit failures. In a third error scenario, the error is in the CTL lane and creates a valid framing pointing to a bogus CRC location. Note in this case the command length must also match the framing results.

The framing state machine shown in FIG. 3 requires the use of the command field of a packet to delineate packet boundaries as can be seen by looking at the exit criteria for the Cmd1 state 301. The state machine can exit the Cmd1 state in response to CTL=10 and enter Crc1 state 305 or in response to CTL=00 and enter data state 307, solely based on the state of the control lines. However, in order to exit the Cmd1 state 301 and enter Cmd2 state 303 (when the next packet is an inserted control packet), the framing state machine needs to determine the length of the Cmd1 control packet. For certain packet sequences described below, this results in the wrong CRC being utilized. Given that the extension is in quanta of 32 bits and largely uncorrelated with other packet beats, it effectively creates a random 32 CRC that is then compared to the transmitted CRC. Hence the detection coverage of such an error is approximately $2^{-32}$. This phenomena increases the overall failure rate of the link (over the full single bit detect case) due to the fact that a single bit error in the command field may go undetected. The magnitude of this effect is highly traffic dependent. The offending pattern occurs when an inserted command immediately follows a command header with data. Consider the following sequences (and assuming no 4 double word commands):

hHCd+c hHHCd+c hHHHCd+c hhHCd+c hhHHCd+c hhHHHCd+c hhhHCd+c hhhHHCd+c hhhHHHCd+c where:

h=header(with data) beat

H=header(without data) beat d+=one or more data beats c=CRC of packet with data

C=CRC of packet without data

Of the above patterns, a single bit error in the initial header beat may cause the following transformations resulting in errors. Exemplary commands are given below the transformations that would cause errors.

hHCd+c→HHCd+c

Example 110000 (RdResp)→010000 (RdSized)

hhHCd+c→HHHCd+c

Example 101110 (WrSized-posted)→111110 (ExtAddr)

hhhHCd+c→hhHHCd+c 111110 (ExtAddr)→101110 (WrSized-posted)

hhhHHCd+c→hhHHHCd+c 111110 (ExtAddr)→101110 (WrSized-posted)

hhHHCd+c→hhhHCd+c

Example 101110 (Wrsized-posted)→111110 (Ext Addr)

Each of the transformations results in an extended/shortened packet with a detection coverage of $2^{-32}$. The exact errors that will be caused of course will depend upon the commands that are allowed in any particular embodiment. From the above patterns one might deduce that these cases could be detected by waiting an additional beat after the CRC beat and ensuring that it is not a data beat, but there are other transformations like: hHCHCHCHCd+c→HHCHCHCHCd+c that require waiting an indeterminate number of beats to detect the error.

Note that there may be differences in error rates based on whether the link is implemented as 2, 4, 8, 16, or 32 bits. For an 8 bit link, since every CTL bit is transmitted twice, every single bit CTL error is detectable. The only other case is when the command is in error. As shown in FIG. 3, in state Cmd1, if CTL=11 & Cmd1 header is complete, then the state machine enters the next state Cmd2. If there is an error in Cmd1's command field, the error in the command field changes either the header length, either shorter or longer, or can change a packet that has data to one that does not and vice versa. Each case must be considered. The error situations considered below include commands that have data and the header length is either shortened or lengthened, which results in treating the wrong beat as the CRC packet. The first column (Has Data) indicates whether a header (control packet) has data associated with it, or, due to an errant command decoding appears to have data when it does not (N→Y) or appears to not have data when it actually does (Y→N). The second column (Header Length) indicates whether the error in the control packet causes the packet decode to indicate the control packet is longer or shorter than it actually is. Those cases that can lead to treating the wrong beat as the CRC are indicated in the table below.

| Has Data | Header Length | |
|---|---|---|
| N | Shorten | Always terminates with a 10, length mismatch will be caught |
| N | Lengthen | Always terminates with a 10, length mismatch will be caught |
| Y | Shorten | This case can lead to treating the wrong beat as crc |
| Y | Lengthen | This case can lead to treating the wrong beat as crc |
| N->Y | — | Will be caught as an illegal transition |

-continued

| | | |
|---|---|---|
| N->Y | Shorten | Will be caught as an illegal transition |
| N->Y | Lengthen | Will be caught as an illegal transition |
| Y->N | — | Will be caught as an illegal transition |
| Y->N | Shorten | Will be caught as an illegal transition |
| Y->N | Lengthen | This case can lead to treating the wrong beat as crc |

If CTL=11 & cmd1 header is not complete then Cmd1
Error in cmd1's command field

| Has Data | Header Length | |
|---|---|---|
| N | Shorten | Beat part of same command |
| N | Lengthen | Beat part of same command |
| Y | Shorten | This case can lead to treating the wrong beat as crc |
| Y | Lengthen | This case can lead to treating the wrong beat as crc |
| N->Y | — | Beat part of same command |
| N->Y | Shorten | Beat part of same command |
| N->Y | Lengthen | Beat part of same command |
| Y->N | — | Will be caught as an illegal transition in subsequent beats |
| Y->N | Shorten | Will be caught as an illegal transition in subsequent beats |
| Y->N | Lengthen | This case can lead to treating the wrong be at as crc |

The cases identified above, where the command field of a packet with data is corrupted may lead to the incorrect beat being used as the CRC result. This will limit the overall link reliability to near the $2^{-32}$ detection rate described above.

The state analysis for a 16 bit link is as follows. With reference to FIG. 3, if CTL=11 & cmd1 header is complete then Cmd2 (note cmd1 must have data)

Single bit error 10 (CTL encoding 11 transformed to 10)—"Has Data" mismatch on cmd1

Single bit error 01 (CTL encoding 11 transformed to 01)—Framing Error

Error in cmd1's command field

An error in the command field change either the header length, i.e., shorten or lengthen, or can change a packet that has data to one that doesn't and visa versa.

Each case must be considered.

| Has Data | Header Length | |
|---|---|---|
| N | Shorten | Always terminates with a 10, length mismatch will be caught |
| N | Lengthen | Always terminates with a 10, length mismatch will be caught |
| Y | Shorten | This case can lead to treating the wrong beat as crc |
| Y | Lengthen | This case can lead to treating the wrong beat as crc |
| N->Y | — | Will be caught as an illegal transition |
| N->Y | Shorten | Will be caught as an illegal transition |
| N->Y | Lengthen | Will be caught as an illegal transition |
| Y->N | — | Will be caught as an illegal transition |
| Y->N | Shorten | Will be caught as an illegal transition |
| Y->N | Lengthen | This case can lead to treating the wrong beat as crc |

If CTL=11 & cmd1 header is not complete then Cmd1
  Single bit error 10(CTL encoding 11 transformed to 10)—This will result in a header length mismatch
  Single bit error 01(CTL encoding 11 transformed to 01)—Framing Error
Error in cmd1's command field

| Has Data | Header Length | |
|---|---|---|
| N | Shorten | Beat part of same command |
| N | Lengthen | Beat part of same command |
| Y | Shorten | This case can lead to treating the wrong beat as crc |
| Y | Lengthen | This case can lead to treating the wrong beat as crc |
| N->Y | — | Beat part of same command |
| N->Y | Shorten | Beat part of same command |
| N->Y | Lengthen | Beat part of same command |
| Y->N | — | Will be caught as an illegal transition in subsequent beats |
| Y->N | Shorten | Will be caught as an illegal transition in subsequent beats |
| Y->N | Lengthen | This case can lead to treating the wrong beat as crc |

If CTL=10 then Crc1
  Single bit error 00—"Has Data" mismatch
  Single bit error 11—Header length mismatch
If CTL=00 then Data
  Single bit error 01—Data length mismatch
  Single bit error 10—"Has Data" mismatch
If CTL=01 then Framing Error
State Cmd2:
  If CTL=11 then Cmd2
    Single bit error 01—Framing error
    Single bit error 10—Header length mismatch
  If CTL=10 then Crc2
    Single bit error 11—Header length mismatch
    Single bit error 00—Framing error
  If CTL=00 then Framing Error
  If CTL=01 then Framing Error
State Crc1:
  If CTL=11 then Cmd1
    a. Single bit error 10—Framing error
    b. Single bit error 01—Framing error
  If CTL=00 then Framing Error
  If CTL=01 then Framing Error
  If CTL=10 then Framing Error
State Crc2:
  If CTL=11 then Cmd2
    Single bit error 10—Framing error
    Single bit error 01—Framing error
  If CTL=00 then Data
    Single bit error 01—Framing error
    Single bit error 10—Framing error
  If CTL=01 then Crc1
    Single bit error 00—Data Length Error
    Single bit error 11
  If CTL=10 then Framing Error
State Data:
  If CTL=11 then Cmd2
    Single bit error 01—Data length mismatch
    Single bit error 10—Framing error
  If CTL=00 then Data
    Single bit error 01—Data length mismatch
    Single bit error 10—Framing error
  If CTL=01 then Crc1
    Single bit error 11—Framing error
    Single bit error 00—Data length mismatch
  If CTL=10 then Framing Error Additionally the following 5 bit CTL column error mappings may result in a packet that uses the incorrect CRC data beat for AC coupled links.

| Original pattern | Received pattern | Error patterns |
|---|---|---|
| 11__11__1 | 00__0x__x, 00__11__1 | 11, 111, 1111, 11111 |
| 11__10__1 | 00__0x__x, 00__11__1 | 111, 1111, 11111, 1101 |
| 11__10__0 | 00__0x__x, 00__11__1 | 111, 1111, 11111, 11011 |
| 00__00__0 | 11__10__x, 11__11__1 | 111, 11101, 11111 |
| 00__00__1 | 11__10__x, 11__11__1 | 111, 11101, 11110 |
| 00__11__1 | 11__10__x, 11__11__1 | 1101, 11011, 11 |
| 00__01__1 | 11__10__x, 11__11__1 | 1111, 11111, 111 |

Of the above error patterns only 11111 does not naturally occur.

Where the command field of a packet with data is corrupted, that may lead to the incorrect beat being used as the CRC result. That limits the overall link reliability to near the $2^{-32}$ detection rate described above. The weakness in the protocol illustrated in FIG. 3 is due to the fact that packets can be inserted into other packets and that there is not a method based solely on CTL to determine when this happens. To be robust the framing state machine should function solely on the values of CTL. Note that there is a simple protocol change that could address this deficiency. If the link protocol precludes a command from being inserted into another command until the first beat of data has been sent, then the framing state machine can operate based solely upon CTL. That effectively removes the arc from the Cmd1 state 301 to the Cmd2 state 303 shown in FIG. 3. The command derived header and data lengths can then be used as an independent validation of the packet. Implementing this rule restores the full single bit detect property (with respect to normal operation). The command derived header and data lengths can then be used as an independent validation of the packet. Doing this would restore the full single bit detect property (with respect to normal operation). Additionally the insertion of a command packet between the last data beat and its CRC would need to be made illegal to prevent the case where in CRC2, a CTL=11 gets transformed to a 01, then the wrong CRC beat would get selected. That can also occur in the data state when a CTL=01 gets transformed into a 11.

For the 16 bit case, an error in the command field may also result in the incorrect CRC beat being used. Again, that can be addressed by prohibiting command insertions until after the first data beat of a command has been transferred. In addition, for AC links where additional encoding such as 8b10b is used, an error in the command field may result in an incorrect beat being used for CRC. That can be eliminated by either changing the encoding from the Cmd1 to Cmd2 state, or by not allowing command insertions to happen until after the first data beat has been transferred.

Another solution is to ensure that all state transitions can be identified by examining the control lines without having to examine the contents of a control packet. That way single bit errors (except on the control lines) will not cause framing errors. Single bit errors on the control lines will get caught by using the information such as header length or data in the packet. With reference again to FIG. 1, one aspect of this solution is to provide a control line for each byte of data. Other embodiments may achieve this with different numbers of control lines per data byte, as long as there are a sufficient number of states from the available control lines to distinguish between all the state transitions in the framing state machine without examining the contents of the packets, except as an error check mechanism.

Figure 4:
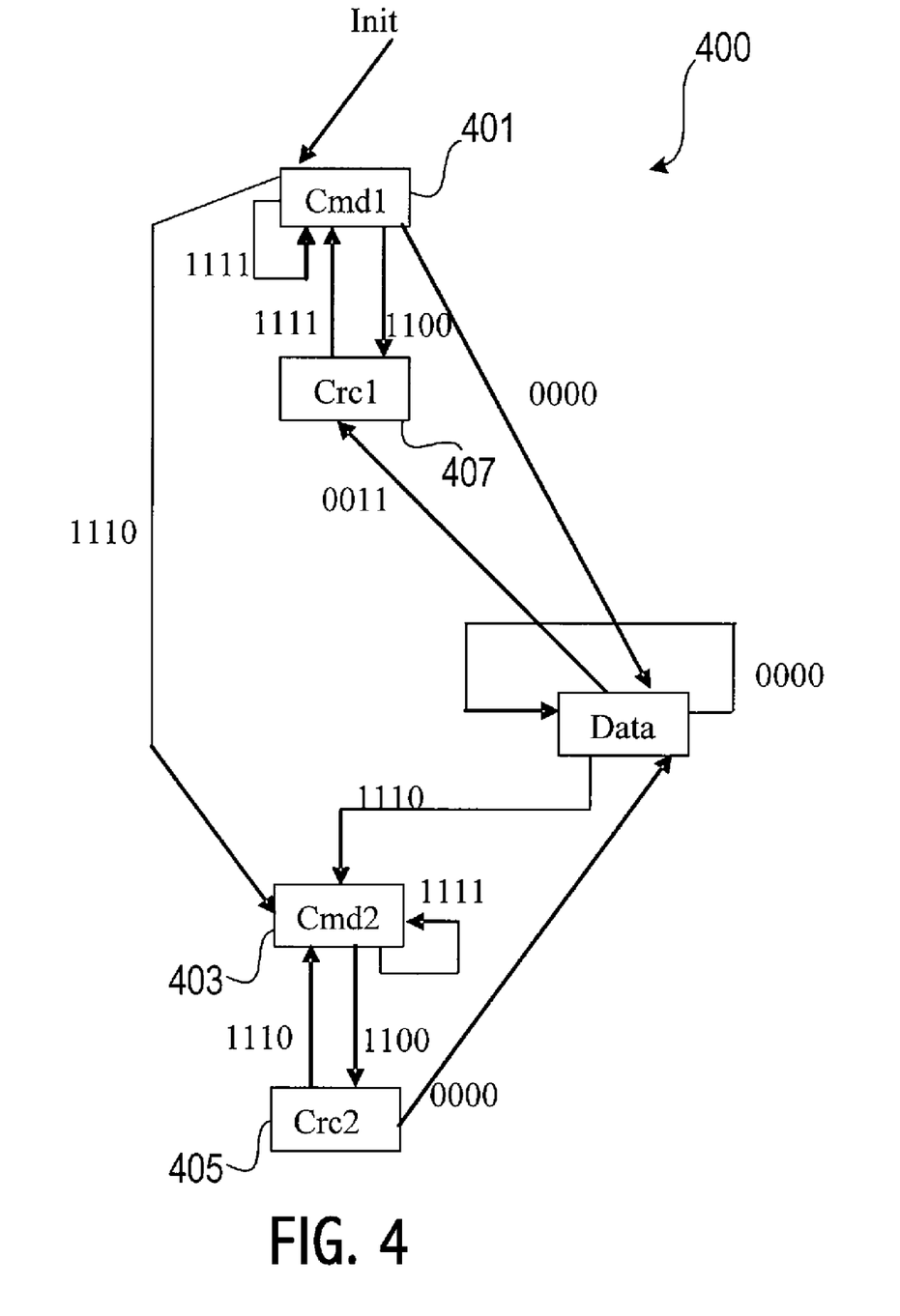
FIG. 4 illustrates an exemplary state machine that operates according to an embodiment of the invention.

Accordingly, assume an embodiment of the link as shown in FIG. 1. With reference to FIG. 4, shown is a state diagram of a framing state machine operable in the transmit and receive interfaces of FIG. 1. The state machine 400 assumes the control encoding as shown in the table below.

| CTL[0:3] | DECODE |
|---|---|
| 1111b | COMMAND (Control Packet) |
| 1110b | INSERTED COMMAND (Inserted Control Packet) |
| 0011b | CRC Packet For COMMAND With DATA |
| 1100b | CRC Packet For COMMAND Without DATA |
| 0000b | DATA Packet |

The control lines encode a separate value when an inserted command is placed on the link. Specifically, when in the Cmd1 state 401, when the control lines are all 1's, the state machine remains in the Cmd1 state. As can be seen from the state machine, all transitions to different states out of the Cmd1 state (and all the other states) are fully encoded by the control lines obviating the need to examine the packet contents to determine when to leave Cmd1 when Cmd2 follows immediately. When the state machine transitions to the Cmd2 state 403 from Cmd1, it does so based on the control line encodings of CTL[0:3]=1110b indicating a state transition. Note that the state machine and the table above show encoding of control lines in the order they are transmitted and received (LSB first) rather than as MSB first. The control lines also encode two different state transitions to distinguish CRC packets that follow data from those that are for a command without data. Note that the states Crc1 and Crc2 both are entered based on a state transition indicating a command without data. Crc2 is utilized for an inserted command. Note that only the first beat of an inserted command utilizes the encodings CTL=1110 and the second and subsequent beats use CTL=111. Because the control lines are able to fully decode all state transitions, the opportunity for single bit errors is reduced resulting in increased reliability of the system.

Referring again to FIG. 1, the receive interface blocks 107 and 111 incorporate the necessary logic to implement the framing state machine described in FIG. 4. In addition, the transmit interface blocks 105 and 109, implement the necessary logic to encode the control lines according to the type of packets that are being supplied to the link in a manner well known in the art.

Using current cost effective high volume testing techniques, individual lanes can currently be tested to a $\sim 10^{-9}$ BERR. Good protocol design should ensure that overall link reliability should not be the dominant reliability factor in system design. By assuring that the link protocol can achieve an effective link failure rate a magnitude less than what is achieved/targeted for the connecting component, while assuming the underlying lane BERR is $10^{-9}$, overall system reliability can be achieved without unduly increasing cost due to qualification/test.

Note that with four bits, depending on the protocol on the bus, additional link transfers may be encoded. For example, the link may be implemented in an environment in which other states are available and transitions between those states can be encoded by the control lines. In particular, with four bits of control, additional state transitions could be defined above the four or five described with relation to FIG. 4. As long as all states are encoded such that the framing state machine does not need to examine the contents of the packet to detect state transitions, the framing state machine can operate with a reduced possibility that single bit errors will significantly decrease system reliability.

Note that although this allows the protocol of the embodiments described herein to meet the single point detection criteria, an implementation must ensure that it implements all the checks/validations required to meet the single bit error detection requirement. For example, the packet contents should still be checked to ensure that single bit errors on control lines causing encoding of the wrong state will be detected by checking the contents of the packets against state encoded by the control lines.

Thus, various embodiments have been described for providing robust error detection in a bus protocol. The description of the invention set forth herein is illustrative, and is not intended to limit the scope of the invention as set forth in the following claims. For example, while certain encodings have been described above for use with the control lines, those encodings are exemplary and other encodings may be utilized and still be within the scope of this invention. Other variations and modifications of the embodiments disclosed herein, may be made based on the description set forth herein, without departing from the scope of the invention as set forth in the following claims.

What is claimed is:

1. A method in a communication link having one or more groups of data lines for transmitting command information in control packets and data information in data packets and a separate control line associated with each group of data lines, the method comprising:
    identifying a first control packet being transmitted on the one or more groups of data lines according to a first encoding of control bits supplied on the one or more control lines associated with the one or more group of data lines; and
    identifying a second control packet being transmitted on the one or more groups of data lines according to a second encoding of the control bits, the second control packet being transmitted immediately after transmission of the first control packet.

2. The method as recited in claim 1 wherein for a second beat of the second control packet the one or more control lines associated with the one or more group of data lines utilize the first encoding.

3. The method as recited in claim 1 wherein the identifying is done by a transmitter by providing an appropriate encoding of the control bits.

4. The method as recited in claim 1 wherein the identifying is done by a receiver by evaluating the control bits.

5. The method as recited in claim 1 further comprising identifying data packets using a third encoding of the control lines.

6. The method as recited in claim 5 further comprising identifying a cyclic redundancy check (CRC) packet using a fourth encoding of the control lines.

7. The method as recited in claim 6 further comprising identifying a second type of CRC packet using a fifth encoding of the control lines.

8. A method comprising:
    associating a control line with each byte of transferred information on a communication link; and
    distinguishing between a first control packet, a second control packet immediately following the first control packet, and data packets, according to respective values of the control line associated with each byte of transferred information, the respective values of the control line associated with each byte of transferred information providing first, second, and third encodings distinguishing the first control packet, the second control packet, and the data packets.

9. The method as recited in claim 8 further comprising using the respective values of the control line associated with each byte of transferred information to distinguish a transferred error checking packet from the data packets and the first and second control packets.

10. The method as recited in claim 8 wherein the use of the control line allows a packet to be determined without using the contents of the packet.

11. An integrated circuit comprising:
    a plurality of first input terminals for receiving data signals;
    one or more control input terminals associated with the data signals; and
    means for framing a first and second packet received consecutively on the first input terminals based solely on the control bits received on the one or more control input terminals.

12. An integrated circuit comprising:
    a plurality of first input terminals for receiving data signals;
    one or more control input terminals associated with the data signals; and
    a state machine responsive to frame a first and second control packet received consecutively on the first input terminals based solely on the control bits received on the one or more control input terminals.

13. The integrated circuit as recited in claim 12 further comprising a control input terminal associated with each 8 bits of first input terminals.

14. The integrated circuit as recited in claim 12 wherein the state machine is further responsive to distinguish different types of error checking packets according to encodings on the one or more control input terminals.

15. The integrated circuit as recited in claim 12 further comprising:
    a plurality of output terminals for transmitting data, address and control information;
    a control output terminal associated with each byte of first output terminals; and
    wherein the integrated circuit is responsive to encode on the control output terminal associated with each byte of the first output terminals, a first encoding to indicate a first control packet is being transmitted and a second encoding to indicate that a second control packet is being transmitted consecutively on the first output terminals.

* * * * *

UNITED STATES PATENT AND TRADEMARK OFFICE
CERTIFICATE OF CORRECTION

| | | |
|---|---|---|
| PATENT NO. | : 7,596,742 B1 | |
| APPLICATION NO. | : 11/379864 | |
| DATED | : September 29, 2009 | |
| INVENTOR(S) | : Mark Hummel | |

It is certified that error appears in the above-identified patent and that said Letters Patent is hereby corrected as shown below:

After Col. 6, line 33, please insert the following paragraph:

--For 8b10b error patterns over all data symbols and running disparities, a random single 10b bit error will be caught 1714 out of 5120 times as a coding error. 1554 out of 5120 can be caught as an incoming disparity error. An additional 40 out of 5120 times the data symbol will be transformed into a control symbol. Of the remaining failures the resulting error patterns are of span 5 or less. There are a total of 16 normalized weight 5 patterns.--

Col. 11, line 16, (claim 1) please replace "group" with --groups--

Col. 11, line 25, (claim 2) please replace "group" with --groups--

Signed and Sealed this

Twenty-sixth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,596,742 B1  Page 1 of 1
APPLICATION NO. : 11/379864
DATED : September 29, 2009
INVENTOR(S) : Mark Hummel It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 792 days.

Signed and Sealed this

Fourteenth Day of December, 2010

David J. Kappos
*Director of the United States Patent and Trademark Office*